(12) United States Patent
Yang et al.

(10) Patent No.: US 9,379,704 B2
(45) Date of Patent: Jun. 28, 2016

(54) TOUCH PANEL

(71) Applicant: HTC Corporation, Taoyuan County (TW)

(72) Inventors: Tun-Chun Yang, Taoyuan County (TW); Chih-Jen Hu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 500 days.

(21) Appl. No.: 13/850,299

(22) Filed: Mar. 26, 2013

(65) Prior Publication Data

US 2014/0174902 A1   Jun. 26, 2014

Related U.S. Application Data

(60) Provisional application No. 61/745,758, filed on Dec. 24, 2012.

(51) Int. Cl.
*H03K 17/96* (2006.01)
*G06F 3/044* (2006.01)

(52) U.S. Cl.
CPC .......... *H03K 17/9622* (2013.01); *G06F 3/044* (2013.01); *G06F 2203/04111* (2013.01); *G06F 2203/04112* (2013.01)

(58) Field of Classification Search
CPC .............. G06F 2203/0411; G06F 2203/04103; B32B 2457/208; H05K 7/02
See application file for complete search history.

(56) References Cited

U.S. PATENT DOCUMENTS

| 5,565,658 | A | 10/1996 | Gerpheide et al. |
| 5,869,791 | A | 2/1999 | Young |
| 6,137,427 | A | 10/2000 | Binstead |
| 7,920,129 | B2 | 4/2011 | Hotelling et al. |

(Continued)

FOREIGN PATENT DOCUMENTS

| CN | 101571781 | 11/2009 |
| CN | 101995993 | 3/2011 |

(Continued)

OTHER PUBLICATIONS

Pi-Lin Lo et al., "Touch Panel", Unpublished U.S. Appl. No. 13/600,233, filed on Aug. 31, 2012.

(Continued)

*Primary Examiner* — Amare Mengistu
*Assistant Examiner* — Shawna Stepp Jones
(74) *Attorney, Agent, or Firm* — Jianq Chyun IP Office

(57) ABSTRACT

A touch panel including a substrate, a plurality of first electrode lines, and a plurality of second electrode lines is provided. The first electrode lines are arranged on the substrate in parallel and extended along a first axial direction. Each first electrode line includes multiple first electrode pads and multiple first bridge portions serially connecting the first electrode pads. Each first electrode pad includes a first central portion and two first side portions connected to the first central portion. The second electrode lines are arranged on the substrate in parallel and extended along a second axial direction perpendicular to the first axial direction. Each second electrode line includes multiple second electrode pads alternatively disposed with the first electrode lines and multiple second bridge portions serially connecting the second electrode pads. Each second electrode pad includes a second central portion and two second side portions connected to the second central portion.

15 Claims, 7 Drawing Sheets

(56) References Cited

U.S. PATENT DOCUMENTS

| 2009/0244021 | A1* | 10/2009 | Matsuo et al. | 345/173 |
|---|---|---|---|---|
| 2011/0227858 | A1* | 9/2011 | An et al. | 345/174 |
| 2012/0019450 | A1* | 1/2012 | Huang et al. | 345/173 |
| 2012/0113046 | A1 | 5/2012 | Akira | |
| 2012/0169649 | A1 | 7/2012 | Chang | |
| 2012/0212448 | A1 | 8/2012 | Lee et al. | |

FOREIGN PATENT DOCUMENTS

| CN | 102262474 | 11/2011 |
|---|---|---|
| CN | 102622129 | 8/2012 |
| CN | 102622151 | 8/2012 |
| EP | 2413223 | 2/2012 |
| GB | 2478804 | 9/2011 |
| JP | 2012053644 | 3/2012 |
| TW | 201110003 | 3/2011 |
| WO | 2005114369 | 12/2005 |

OTHER PUBLICATIONS

"Office Action of Taiwan Counterpart Application", issued on Dec. 16, 2014, p. 1-p. 6, in which the listed references were cited.
"Office Action of European Counterpart Application", issued on Sep. 4, 2014, p. 1-p. 7.
"Search Report of Europe Counterpart Application", issued on Feb. 13, 2014, p. 1-p. 4, in which the listed references were cited.
"Office Action of Europe Counterpart Application", issued on Feb. 24, 2014, p. 1-p. 7.
"Office Action of China Counterpart Application", issued on Mar. 30, 2016, p. 1-p. 8, in which the listed references were sited.

* cited by examiner

TOUCH PANEL

CROSS-REFERENCE TO RELATED APPLICATION

This application claims the priority benefits of U.S. provisional application Ser. No. 61/745,758, filed on Dec. 24, 2012. The entirety of the above-mentioned patent application is hereby incorporated by reference herein and made a part of this specification.

BACKGROUND OF THE INVENTION

1. Field of the Invention

The present application generally relates to a panel, and more particularly, to a touch panel.

2. Description of Related Art

In recent years, along with the development and widespread of digital information and wireless communication technologies, the conventional input devices, such as keyboards and mouses, of many electronic information products, such as mobile phones, handheld PC, and smart phones, have been replaced by touch panels in order to allow users to operate such electronic information products more conveniently.

Touch panels can be generally categorized into resistive touch panels, capacitive touch panels, optical touch panels, acoustic wave touch panels, and electromagnetic touch panels based on their touch sensing techniques. Capacitive touch panels have been broadly applied to different electronic products thanks to their fast response time, high reliability, and high durability. In a capacitive touch panel, a single layer or multiple layers of transparent electrode patterns are formed on a substrate as touch sensors. Thus, a user can touch the surface of the touch panel by using a touch tool (for example, a stylus or a finger) to operate the touch panel. Thereby, how to improve the touching sensitivity of a touch panel has become a major subject in the industry.

SUMMARY OF THE INVENTION

Accordingly, the present application is directed to a touch panel with high touching sensitivity.

The present application provides a touch panel. The touch panel includes a substrate, a plurality of first electrode lines, and a plurality of second electrode lines. The first electrode lines are arranged on the substrate in parallel and extended along a first axial direction. Each of the first electrode lines includes a plurality of first electrode pads and a plurality of first bridge portions serially connecting the first electrode pads. Each first electrode pad includes a first central portion and two first side portions. The first central portion is in a rectangular shape and has a first width perpendicular to the first axial direction. The two first side portions are connected to two opposite sides of the first central portion in the first axial direction. Each of the first side portions is in a rectangular shape and has a second width perpendicular to the first axial direction, where the first width is greater than the second width. Each of the first bridge portions connects the corresponding two first side portions of two adjacent first electrode pads. The second electrode lines are arranged on the substrate in parallel and extended along a second axial direction. Each of the second electrode lines includes a plurality of second electrode pads and a plurality of second bridge portions serially connecting the second electrode pads. The second axial direction is perpendicular to the first axial direction, and the first electrode lines are electrically insulated from the second electrode lines. The second electrode pads of each second electrode line and the first electrode lines are alternatively disposed in the first axial direction. Each of the second electrode pads includes a second central portion and two second side portions. The second central portion is in a rectangular shape and is located between the corresponding two first bridge portions of two adjacent first electrode lines. The second central portion has a third width perpendicular to the first axial direction. The two second side portions are connected to two opposite sides of the second central portion in the first axial direction. Each of the second side portions is in a rectangular shape and has a fourth width perpendicular to the first axial direction, where the third width is greater than the fourth width. Each of the second bridge portions crosses the corresponding first bridge portion and serially connects two adjacent second central portions in the second axial direction.

As described above, in a touch panel provided by the present application, the second electrode pads of a second electrode line are alternatively disposed with the first electrode lines in the first axial direction, and the first electrode pads and the second electrode pads have symmetrical shapes, so that the layout space on the substrate can be efficiently used, and the mutual inductive capacitance between each first electrode pad and the adjacent second electrode pad can be increased. Thereby, the touch panel offers a high touching sensitivity.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
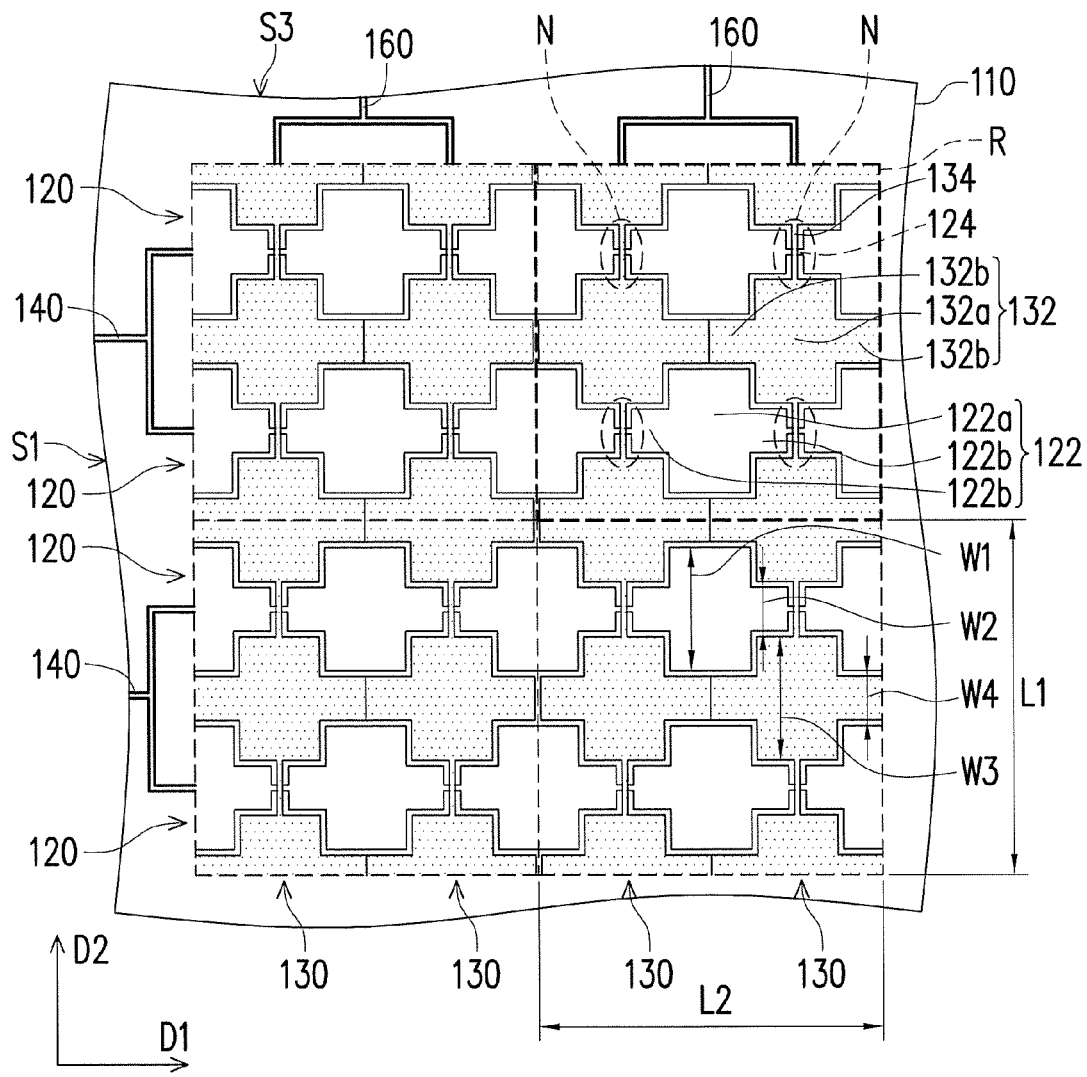
FIG. 1 is a diagram of a touch panel according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a touch panel according to an embodiment of the present invention. Referring to FIG. 1, in the present embodiment, the touch panel 100 includes a substrate 110, a plurality of first electrode lines 120, and a plurality of second electrode lines 130. The first electrode lines 120 are arranged on the substrate 110 in parallel and extended along a first axial direction D1. The second electrode lines 130 are arranged on the substrate 110 and extended along a second axial direction D2, where the second axial direction D2 is perpendicular to the first axial direction D1, and the first electrode lines 120 are electrically insulated from the second electrode lines 130. The substrate 110 may be made of glass, plastic, or another material. The first electrode lines 120 and the second electrode lines 130 may be made of indium tin oxide (ITO), metal meshes, silver nano wires, carbon nano tubes (CNT), polymer conductive layers, or some other materials and can be formed on the substrate 110 through photolithography processes, screen printing processes, and some other processes. However, the types and formation methods of the substrate 110, the first electrode lines 120, and the second electrode lines 130 are not limited in the present application.

Figure 2:
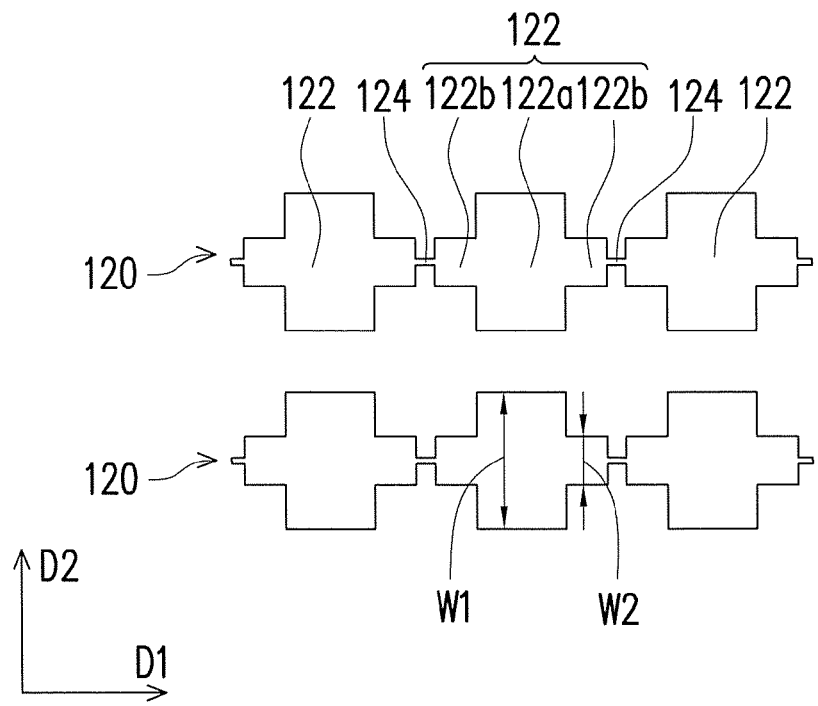
FIG. 2 is an enlarged partial view of first electrode lines in FIG. 1.

FIG. 2 is an enlarged partial view of the first electrode lines in FIG. 1. Referring to FIG. 1 and FIG. 2, in the present embodiment, each first electrode line 120 is extended along the first axial direction D1 and includes a plurality of first electrode pads 122 and a plurality of first bridge portions 124 serially connecting the first electrode pads 122. Each first bridge portion 124 serially connects two adjacent first electrode pads 122 along the first axial direction D1. Each first electrode pad 122 includes a first central portion 122a and two first side portions 122b. The first central portion 122a is in a rectangular shape and has a first width w1 perpendicular to the first axial direction D1. The two first side portions 122b are connected to two opposite sides of the first central portion 122a in the first axial direction D1. Each first side portion 122b is in a rectangular shape and has a second width w2 perpendicular to the first axial direction D1, where the first width w1 is greater than the second width w2. Thus, the two first side portions 122b can be considered as protruding from two opposite sides of the first central portion 122a in the first axial direction D1.

In the present embodiment, each first electrode pad 122 has a crisscross shape and a plurality of sides. The first central portion 122a and one first side portion 122b of each first electrode pad 122 and the first central portion 122a and the corresponding first side portion 122b of an adjacent first electrode pad 122 can form an "H" shape along the first axial direction D1. Thus, the two first side portions 122b are symmetrically connected to two opposite sides of the first central portion 122a, so that the first electrode pad 122 is symmetrical in both the first axial direction D1 and the second axial direction D2, and the number of sides of the first electrode pad 122 is increased due to the first side portions 122b. In this case, each first bridge portion 124 serially connecting two adjacent first electrode pads 122 is actually connected to the corresponding two first side portions 122b of two adjacent first electrode pads 122 in the first axial direction D1 to extend the first electrode lines 120 along the first axial direction D1.

Figure 3:
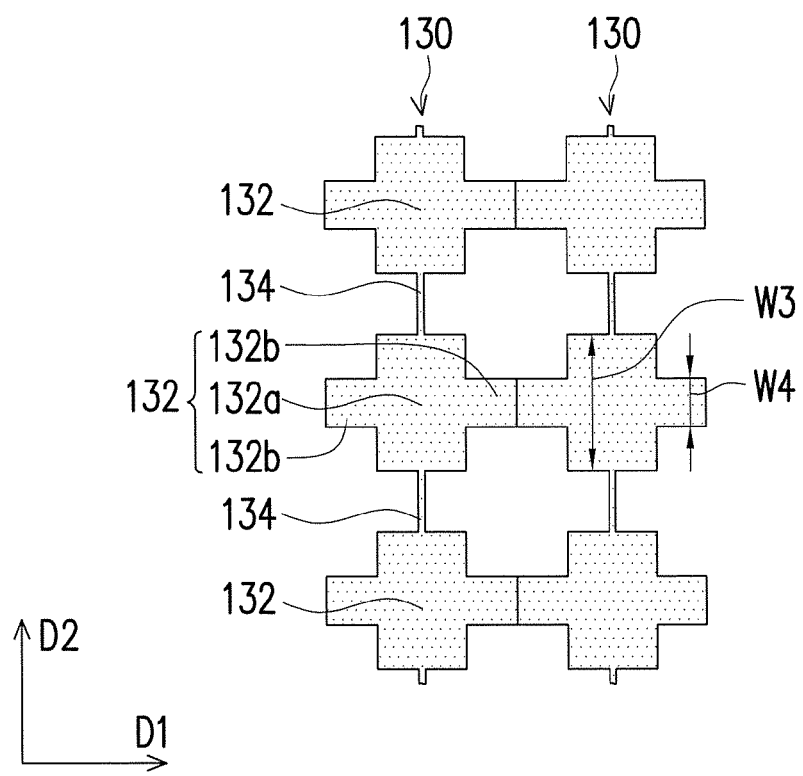
FIG. 3 is an enlarged partial view of second electrode lines in FIG. 1.

FIG. 3 is an enlarged partial view of the second electrode lines in FIG. 1. Referring to FIG. 1 and FIG. 3, in the present embodiment, each second electrode line 130 is extended along the second axial direction D2 that is perpendicular to the first axial direction D1 and includes a plurality of second electrode pads 132 and a plurality of second bridge portions 134 serially connecting the second electrode pads 132. Each second bridge portion 134 serially connects two adjacent second electrode pads 132 along the second axial direction D2. Each second electrode pad 132 includes a second central portion 132a and two second side portions 132b. The second central portion 132a is in a rectangular shape and has a third width w3 perpendicular to the first axial direction D1. The two second side portions 132b are connected to two opposite sides of the second central portion 132a in the first axial direction D1. Each second side portion 132b is in a rectangular shape and has a fourth width w4 perpendicular to the first axial direction D1, where the third width w3 is greater than the fourth width w4. Thus, the two second side portions 132b can be considered as protruding from two opposite sides of the second central portion 132a in the first axial direction D1.

In the present embodiment, each second electrode pad 132 has a crisscross shape and a plurality of sides. Half of each second electrode pad 132 along the second axial direction D2 and another half of an adjacent second electrode pad 132 along the second axial direction D2 can form a "I" shape along the second axial direction D2. Herein the "I" shape can be considered as the "H" shape rotated for 90°. Thus, the two second side portions 132b are symmetrically connected to the opposite two sides of the second central portion 132a, so that the second electrode pad 132 can be symmetrical in both the first axial direction D1 and the second axial direction D2, and the number of sides of the second electrode pad 132 is increased due to the second side portions 132b. In addition, the first electrode pads 122 and the second electrode pads 132 have similar shapes and sizes such that the sensing linearity of the touch panel 100 in the first axial direction D1 and the second axial direction D2 is increased. In this case, each second bridge portion 134 serially connecting two adjacent second electrode pads 132 is actually connected to the corresponding two second central portions 132a of two adjacent second electrode pads 132 in the second axial direction D2 to extend the second electrode lines 130 along the second axial direction D2.

Referring to FIGS. 1-3, in the present embodiment, the first electrode lines 120 and the second electrode lines 130 are disposed on the same surface of the substrate 110, where the first electrode pads 122 of the first electrode lines 120 and the second electrode pads 132 of the second electrode lines 130 are substantially coplanar, and the first electrode pads 122 do not overlap the second electrode pads 132. The second electrode pads 132 of each second electrode line 130 are alternatively disposed with the first electrode lines 120 in the first axial direction D1, so that the first electrode lines 120 extended along the first axial direction D1 and the second electrode lines 130 extended along the second axial direction D2 are perpendicular to and cross each other. Each second bridge portion 134 crosses the corresponding first bridge portion 124. The first bridge portions 124 are directly disposed on the substrate 110, while the second bridge portions 134 are disposed on the substrate 110 by spanning over the first bridge portions 124. However, the present application is not limited by the dispositions described above. A dielectric layer (not shown) or any other component which can electrically insulate the first bridge portions 124 and the second bridge portions 134 may be disposed between the first bridge portions 124 and the second bridge portions 134 to electrically insulate the first electrode lines 120 from the second electrode lines 130.

In the present embodiment, the second central portion 132a of each second electrode pad 132 is located between the corresponding two first bridge portions 124 of two adjacent first electrode lines 120. Because each first bridge portion 124 connects two corresponding first side portions 122b along the first axial direction D1, each second central portion 132a can be considered as being located among four first side portions 122b connected to two corresponding first bridge portions 124. To be specific, each first side portion 122b is located between two second central portions 132a of two adjacent second electrode lines 130 along the second axial direction D2 and is connected to another first side portion 122b through a first bridge portion 124 along the first axial direction D1, and each second side portion 132b is located between two first central portions 122a of two adjacent first electrode lines 120 along the second axial direction D2 and is corresponding to another second side portion 132b along the first axial direction D1.

Thereby, the first electrode pads 122 and the second electrode pads 132 are alternatively arranged through the first side portions 122b and the second side portions 132b, so that the sides of the first electrode pads 122 and the sides of the second electrode pads 132 can be corresponding to each other. For example, in the present embodiment, a first electrode pad 122 and an adjacent second electrode pad 132 have three corresponding sides. Accordingly, the mutual induction effect between the first electrode pads 122 and the second electrode pads 132 can be enhanced, and the mutual inductive capacitance thereof can be increased. In addition, because the first electrode pads 122 of the first electrode lines 120 and the second electrode pads 132 of the second electrode lines 130 have symmetrical shapes and similar sizes in both the first axial direction D1 and the second axial direction D2, the inductive capacitance of the touch panel 100 in each direction can be increased, and accordingly the touch panel 100 can offer a good sensing linearity in touch signal operations.

On the other hand, referring to FIG. 1 to FIG. 3, in the present embodiment, the first electrode lines 120 do not contact each other (as shown in FIG. 2). Thus, each first electrode line 120 can serve as a signal line (for example, one of a scan line and a data line) for transmitting signals along the first axial direction D1. Additionally, every adjacent two second electrode lines 130 are connected with each other through the second side portions 132b of the corresponding second electrode pads 132. Thus, every adjacent two second electrode lines 130 are electrically connected with each other through the second side portions 132b of the corresponding second electrode pads 132 in the first axial direction D1, so that the two connected second electrode lines 130 can be served as a signal line (for example, another one of a scan line and a data line) for transmitting signals along the second axial direction D2. In other embodiments, the second electrode lines 130 do not contact each other, so that each second electrode line 130 can serve as a signal line for transmitting signals along the second axial direction D2. However, whether every adjacent two second electrode lines 130 are connected with each other or not is not limited in the present application.

Referring to FIG. 1, in the present embodiment, the touch panel 100 is divided into a plurality of signal unit areas R. The signal unit areas R are respectively in a rectangular shape and are arranged on the substrate 110 as an array. Two signal lines for transmitting signals along the first axial direction D1 and one signal line for transmitting signals along the second axial direction D2 pass through each signal unit area R, and each signal unit area R has four nodes N. The two signal lines transmitting signals along the first axial direction D1 are aforementioned two first electrode lines 120, the signal line transmitting signals along the second axial direction D2 is aforementioned two connected second electrode lines 130, and the nodes N are intersections of the first bridge portions 124 and the second bridge portions 134. Herein because the inductive capacitance of the first electrode pads 122 and the second electrode pads 132 is increased, the mutual induction effect between the first electrode lines 120 and the second electrode line 130 passing through each signal unit area R is enhanced. Accordingly, the touch panel 100 offers a high touching sensitivity and can be applied to an electronic device with a touch tool having a small contact area (for example, a finger or a stylus). Or, any touch-control state with a non-conductive shield (for example, a glove) can also be supported through the improvement of the touching sensitivity of the touch panel 100.

In the present embodiment, the lengths of the sides L1 and L2 of each rectangular signal unit area R are between 2 mm and 6 mm, where the length of the side L1 is close to the sum of the first widths w1 of the first central portions 122a of two first electrode pads 122 and the fourth widths w4 of the second side portions 132b of two adjacent second electrode pads 132, and the length of the side L2 is close to the length of two second electrode pads 132 in the first axial direction D1. Thus, the sum of the first width w1 of the first central portion 122a of each first electrode pads 122 and the fourth width w4 of the adjacent second side portions 132b along the first axial direction D1 is between 1 mm and 3 mm, and the length of the second electrode pad 132 along the first axial direction D1 is between 1 mm and 3 mm. However, the proportion of the first width w1 to the second width w2 and the proportion of the third width w3 to the fourth width w4 are not limited in the present invention, and whether the proportion of the first width w1 to the second width w2 is equal to the proportion of the third width w3 to the fourth width w4 or not is not limited in the present application either. The values of the first width w1, the second width w2, the third width w3, and the fourth width w4 can be adjusted according to the actual requirement.

Referring to FIG. 1 again, in the present embodiment, the touch panel 100 further includes a plurality of first conductive lines 140 and a plurality of third conductive lines 160. The first conductive lines 140 are disposed on a first side S1 of the substrate 110, where every adjacent two first electrode lines 120 are connected with each other through the two first electrode pads 122 close to the first side S1 and the corresponding first conductive line 140. The third conductive lines 160 are disposed on a third side S3 of the substrate 110, where every adjacent two second electrode lines 130 are connected with each other through the two second electrode pads 132 close to the third side S3 and the corresponding third conductive line 160, and the third side S3 is adjacent to the first side S1. Accordingly, the first electrode lines 120 for transmitting signals along the first axial direction D1 and the second electrode lines 130 for transmitting signals along the second axial direction D2 can respectively transmit signals to the first conductive lines 140 and the third conductive lines 160.

Figure 4:
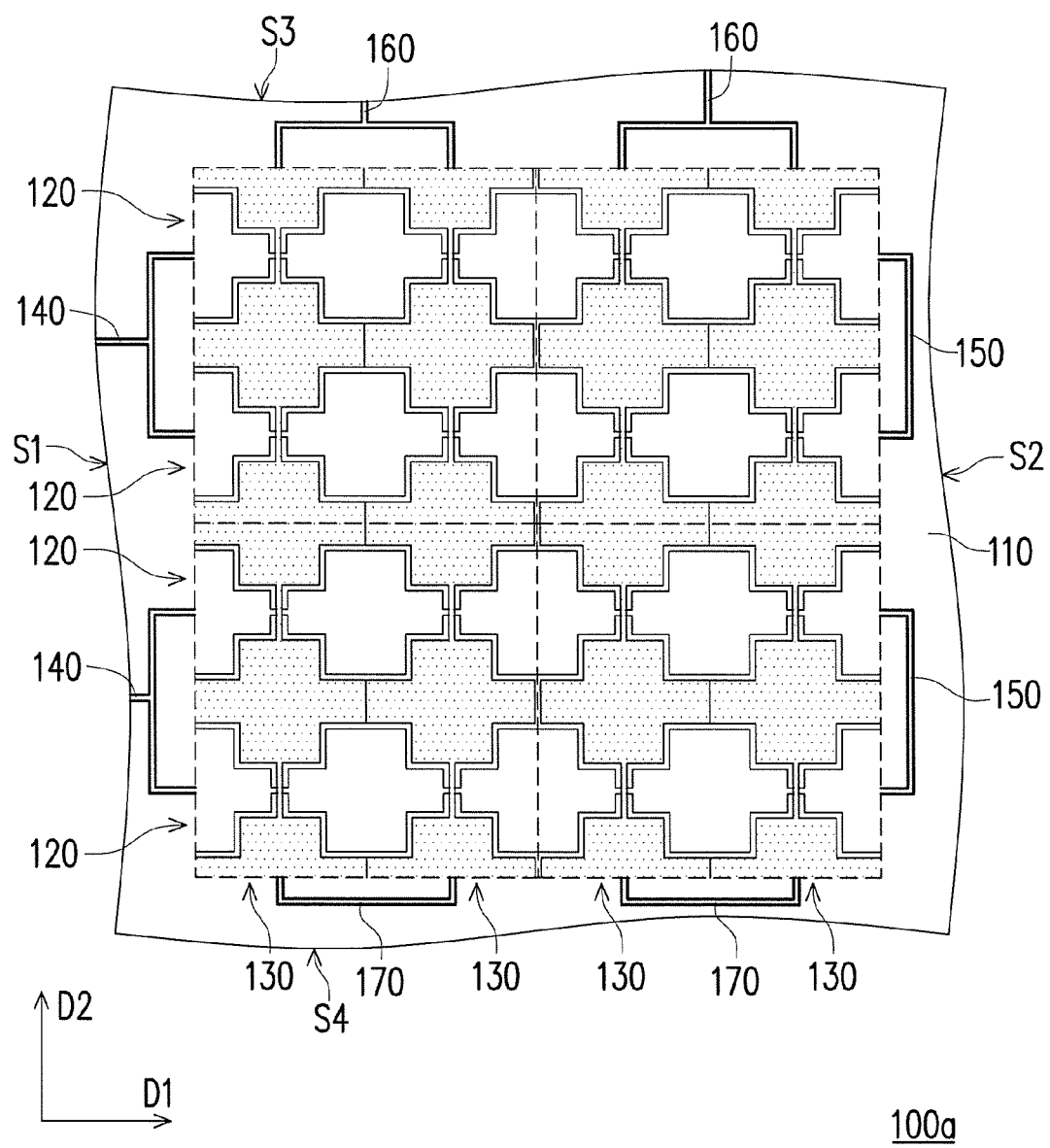
FIG. 4 is a diagram of a touch panel according to another embodiment of the present invention.

FIG. 4 is a diagram of a touch panel according to another embodiment of the present invention. Referring to FIG. 4, in the present embodiment, besides the first conductive lines 140 and the third conductive lines 160, the touch panel 100a further includes a plurality of second conductive lines 150 and a plurality of fourth conductive lines 170. The second conductive lines 150 are disposed on a second side S2 of the substrate 110 that is opposite to the first side S1, where every adjacent two of the first electrode lines 120 are connected with each other through the two first electrode pads 122 close to the second side S2 and the corresponding second conductive line 150. The fourth conductive lines 170 are disposed on a fourth side S4 of the substrate 110 that is opposite to the third side S3, where every adjacent two second electrode lines 130 are connected with each other through the two second electrode pads 132 close to the fourth side S4 and the corresponding fourth conductive line 170, and the second side S2 is adjacent to the fourth side S4. Thus, in the touch panel 100a, every adjacent two first electrode lines 120 are connected in parallel, and every adjacent two second electrode lines 130 are connected in parallel, so that the impedances of the first electrode lines 120 and the second electrode lines 130 are reduced. In addition, the first conductive lines 140 and the second conductive lines 150 are respectively disposed at two ends of the first electrode lines 120, and the third conductive lines 160 and the fourth conductive lines 170 are respectively disposed at two ends of the second electrode lines 130, so that the sensing pattern of the touch panel 100a is made more symmetrical, and accordingly the sensitivity of the touch panel 100a at the four sides S1-S4 is made more uniform.

Figure 5:
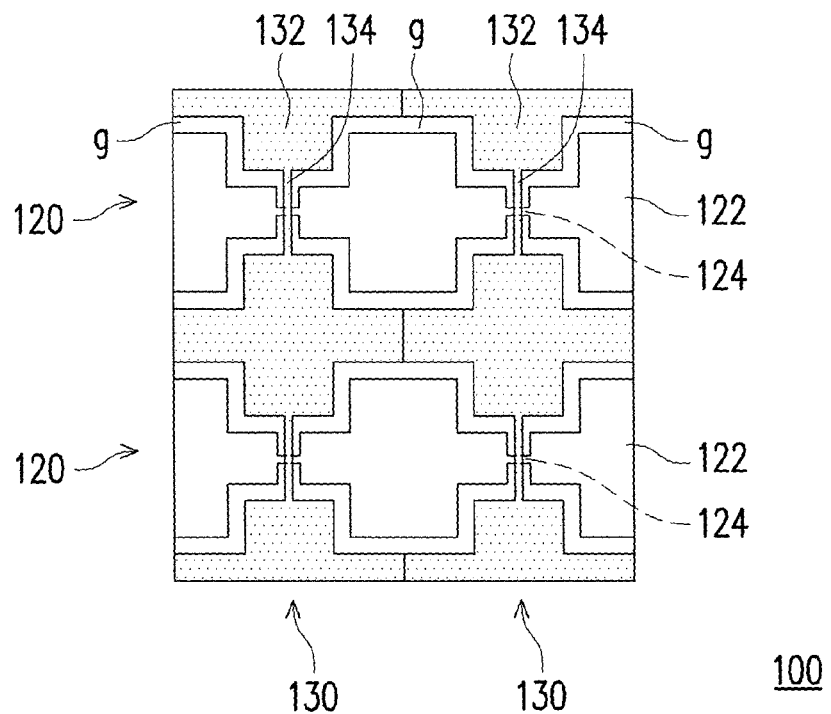
FIG. 5 is an enlarged partial view of the touch panel in FIG. 1.

FIG. 5 is an enlarged partial view of the touch panel in FIG. 1. Referring to FIG. 5, in the present embodiment, a plurality of gaps g exists between the first electrode pads 122 and the second electrode pads 132. The width of the gaps g may be between 10 μm and 500 μm. However, width of the gaps g is not limited in the present invention. When a first electrode pad 122 and an adjacent second electrode pad 132 are too close to each other, the touching sensitivity between the first electrode pad 122 and the second electrode pad 132 will be very high, and the touch panel 100 tends to be affected by external interferences (for example, misoperations). Thus, by spacing the first electrode pads 122 and the second electrode pads 132 relatively farther to create the gaps g between adjacent first electrode pads 122 and second electrode pads 132, external interference to the touch panel 100 is reduced without sacrificing the touching sensitivity of the touch panel 100 too much or affecting the operation of the touch panel 100.

Figure 6:
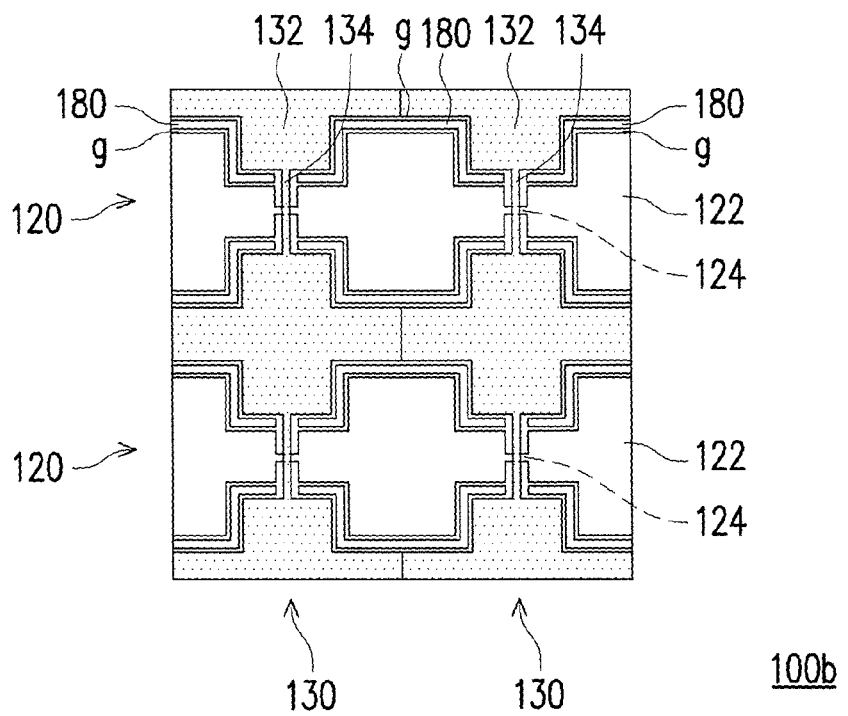
FIGS. 6-11 are enlarged partial views of touch panels according to other embodiments of the present invention.

FIGS. 6-11 are enlarged partial views of touch panels according to other embodiments of the present invention. Referring to FIG. 6, in the embodiment illustrated in FIG. 6, the touch panel 100b further includes a plurality of dummy patterns 180 disposed in the gaps g. The dummy patterns 180 in the embodiment illustrated in FIG. 6 are strip-shaped. Thus, a dummy pattern 180 is disposed in each gap g, where the length of the dummy pattern 180 is between 25 μm and 450 μm, and the distance between the dummy pattern 180 and the adjacent first electrode pad 122 and the distance between the dummy pattern 180 and the adjacent second electrode pad 132 are between 10 μm and 40 μm. When the gaps g exist between the first electrode pads 122 and the second electrode pads 132, some optical problems may be produced in the touch panel 100b (for example, the gaps g become visible from outside of the touch panel 100b). Thus, when the gaps g are formed in the touch panel 100b to reduce the inductive capacitance of the first electrode pads 122 and the second electrode pads 132 and, moreover, to prevent the touch panel 100b from being affected by external interferences, aforementioned optical problems can be resolved by disposing the dummy patterns 180 in the gaps g.

Figure 7:
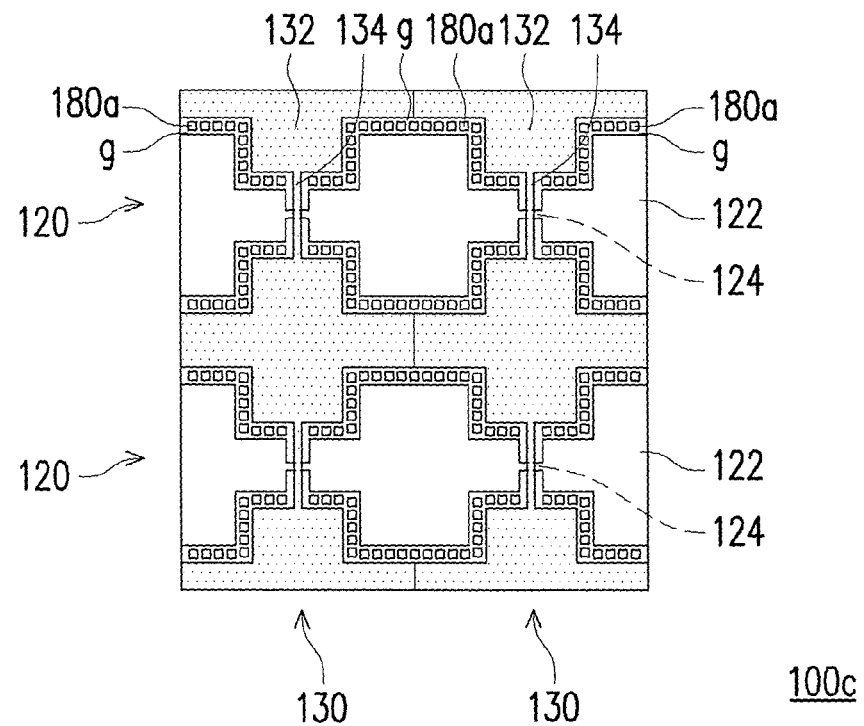

Similarly, referring to FIG. 7, in the embodiment illustrated in FIG. 7, the touch panel 100c includes a plurality of dummy patterns 180a disposed in the gaps g. In the embodiment illustrated in FIG. 7, the dummy patterns 180a are block-shaped. Thus, multiple dummy patterns 180a are disposed in each gap g, where the length of the dummy patterns 180a is between 25 μm and 450 μm, and the distance between the dummy patterns 180a and the adjacent first electrode pad 122 and the distance between the dummy patterns 180a and the adjacent second electrode pad 132 are between 10 μm and 40 μm. Thus, the dummy patterns 180a can achieve the same function as the dummy patterns 180.

Figure 8:
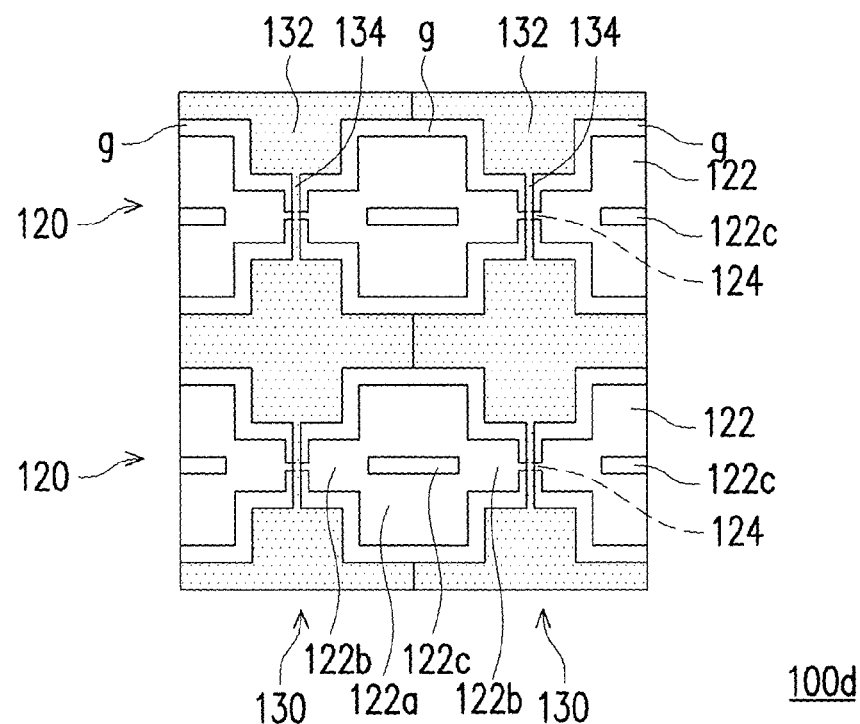

Referring to FIG. 8, in the present embodiment, each first electrode pad 122 of the touch panel 100d has an opening 122c. The opening 122c is located at the first central portion 122a of each first electrode pad 122. By forming the opening 122c on each first electrode pad 122, the surface area of the first electrode pad 122, and accordingly the capacitance thereof, is reduced. Besides, by forming the opening 122c on the first central portion 122a, the edge of each first electrode pad 122 is not affected by the opening 122c, and the mutual induction effect between the first electrode pad 122 and the adjacent second electrode pad 132 can be maintained. In addition, in the present embodiment, each first electrode pad 122 is assumed to have one opening 122c. However, the number of the opening 122c on each first electrode pad 122 is not limited in the present invention, and in other embodiments, each first electrode pad 122 may have two or more openings 122c according to the actual requirement.

Figure 9:
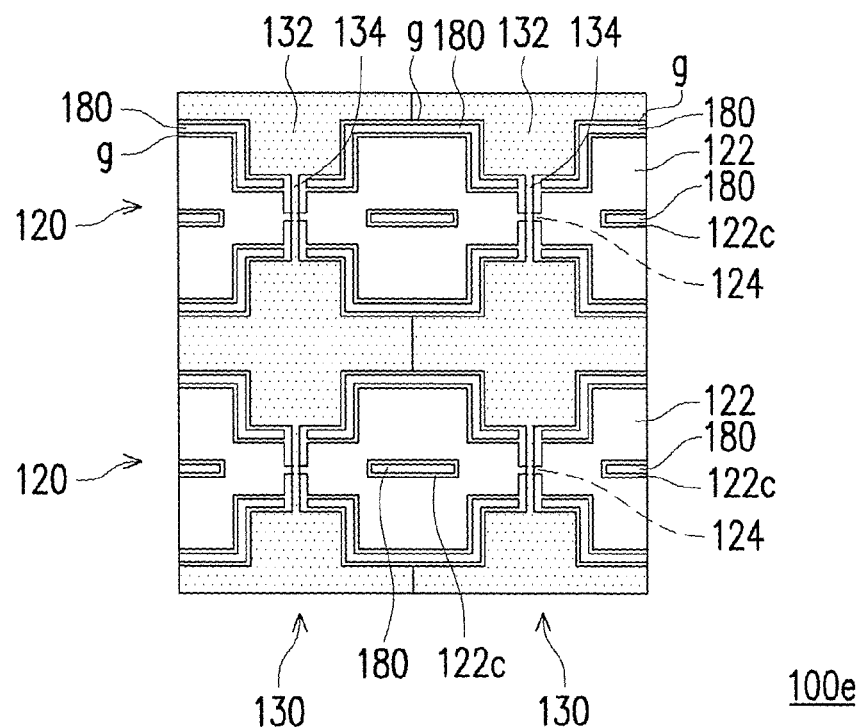
Figure 10:
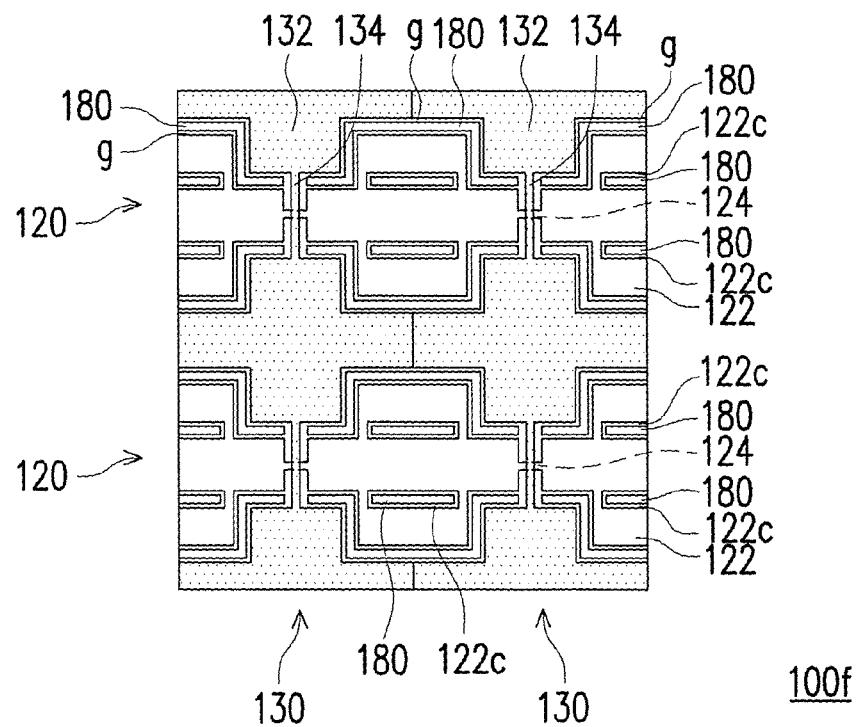

Referring to FIG. 9 to FIG. 10, in the touch panels 100e and 100f provided by the embodiments illustrated in FIG. 9 and FIG. 10, the gaps g exist between the first electrode pads 122 and the second electrode pads 132, and the strip-shaped dummy patterns 180 are disposed in the gaps g. The difference between the touch panel 100e and the touch panel 100f is that each first electrode pad 122 in the touch panel 100e has an opening 122c, while each first electrode pad 122 in the touch panel 100f has two openings 122c. In the embodiments illustrated in FIG. 9 and FIG. 10, the strip-shaped dummy patterns 180 are also disposed in the openings 122c besides in the gaps g. The length of the dummy patterns 180 is between 25 μm and 450 μm, and the distance between each dummy pattern 180 and the adjacent first electrode pad 122 is between 10 μm and 40 μm. When the first electrode pads 122 come with the openings 122c, the openings 122c may, as the gaps g, cause aforementioned optical problems (for example, the openings 122c are visible from outside the touch panels 100e and 100f) in the touch panels 100e and 100f. Thus, when the openings 122c are formed in the touch panels 100e and 100f to reduce the capacitance of the first electrode pads 122, aforementioned optical problems can be resolved by disposing the dummy patterns 180 into the openings 122c.

Figure 11:
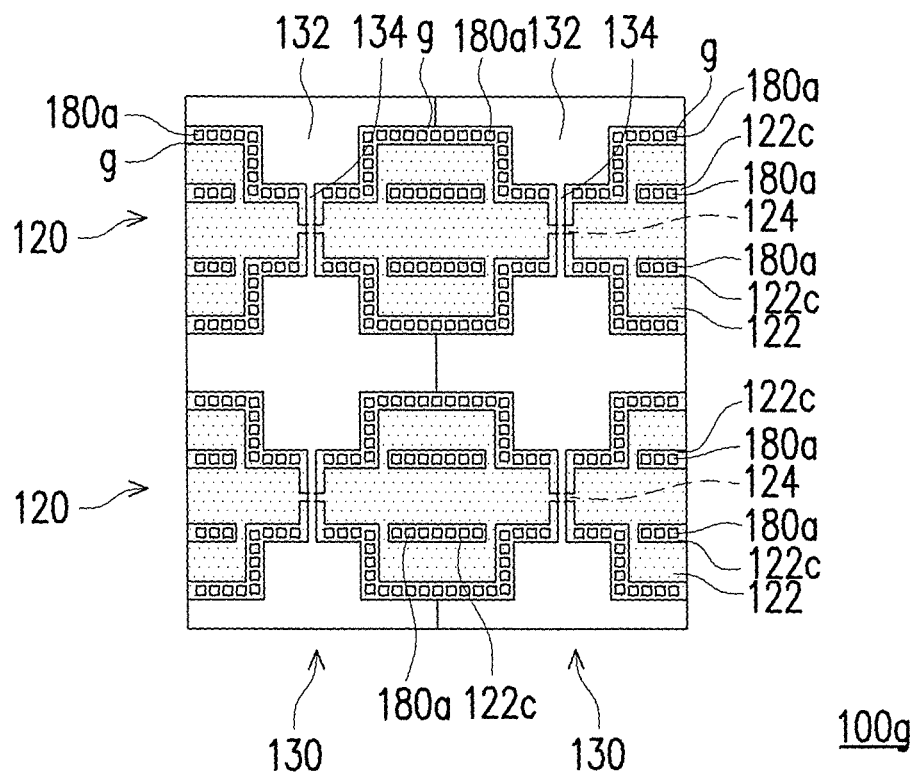

Similarly, referring to FIG. 11, in the embodiment illustrated in FIG. 11, the gaps g exist between the first electrode pads 122 and the second electrode pads 132 of the touch panel 100g, and the block-shaped dummy patterns 180a are disposed in the gaps g. In the embodiment illustrated in FIG. 11, each first electrode pad 122 has an opening 122c, and the block-shaped dummy patterns 180a are also disposed in the openings 122c besides the gaps g. The length of the dummy patterns 180a is between 25 μm and 450 μm, and the distance between each dummy pattern 180a and the adjacent first electrode pad 122 is between 10 μm and 40 μm. Thus, just like disposing the dummy patterns 180 in the openings 122c, aforementioned optical problem can be resolved by disposing the dummy patterns 180a in the openings 122c.

As described above, in a touch panel provided by the present invention, the second electrode pads of a second electrode line are alternatively disposed with the first electrode lines in the first axial direction, and the first electrode pads and the second electrode pads have symmetrical shapes. Each second central portion is located between adjacent two first electrode lines and serially connected between two first bridge portions of a first electrode pad, so that the layout space on the substrate can be efficiently used, the inductive capacitance between each first electrode pad and the adjacent second electrode pad can be increased, and the mutual induction effect of the touch panel in each direction can be enhanced. Thus, the touch panel offers a good sensing linearity in touch signal operations and a high touching sensitivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch panel, comprising: a substrate; a plurality of first electrode lines, arranged on the substrate in parallel, and extended along a first axial direction, wherein each of the first electrode lines comprises a plurality of first electrode pads and a plurality of first bridge portions serially connecting the first electrode pads, and each of the first electrode pads comprises: a first central portion, in a rectangular shape, and having a first width perpendicular to the first axial direction; and two first side portions, connected to two opposite sides of the first central portion in the first axial direction, wherein each of the first side portions is in a rectangular shape and has a second width perpendicular to the first axial direction, the first width is greater than the second width, and each of the first bridge portions connects the corresponding two first side portions of two adjacent first electrode pads; and a plurality of second electrode lines, arranged on the substrate in parallel, and extended along a second axial direction, wherein each of the second electrode lines comprises a plurality of second electrode pads and a plurality of second bridge portions serially connecting the second electrode pads, the second axial direction is perpendicular to the first axial direction, the first electrode lines are electrically insulated from the second electrode lines, the second electrode pads of each of the second electrode lines and the first electrode lines are alternatively disposed in the first axial direction, and each of the second electrode pads comprises: a second central portion, in a rectangular shape, located between the corresponding two first bridge portions of two adjacent first electrode lines, and having a third width perpendicular to the first axial direction; and two second side portions, connected to two opposite sides of the second central portion in the first axial direction, wherein each of the second side portions is in a rectangular shape and has a fourth width perpendicular to the first axial direction, the third width is greater than the fourth width, each of the second bridge portions crosses the corresponding first bridge portion, and each of the second bridge portions serially connects two adjacent second central portions in the second axial direction, the plurality of second electrode lines are arranged as a plurality of pairs, each of the pairs comprises two adjacent second electrode lines connected with each other by their second side portions in a horizontal direction, and the pairs are electrically isolated from each other in the horizontal direction.

2. The touch panel according to claim 1, wherein each of the first side portions is located between the two second central portions of the adjacent second electrode line, and each of the second side portions is located between the two first central portions of two adjacent first electrode lines.

3. The touch panel according to claim 2, wherein a sum of the first width of the first central portion of each of the first electrode pads and the fourth width of the adjacent second side portion is between 1 mm and 3 mm, and a length of the second electrode pad in the first axial direction is between 1 mm and 3 mm.

4. The touch panel according to claim 1 further comprising: a plurality of first conductive lines, disposed on a first side of the substrate, wherein every adjacent two of the first electrode lines are connected with each other through the two first electrode pads close to the first side and the corresponding first conductive line.

5. The touch panel according to claim 4 further comprising: a plurality of second conductive lines, disposed on a second side of the substrate that is opposite to the first side, wherein every adjacent two of the first electrode lines are connected with each other through the two first electrode pads close to the second side and the corresponding second conductive line.

6. The touch panel according to claim 1 further comprising: a plurality of third conductive lines, disposed on a third side of the substrate, wherein every adjacent two of the second electrode lines are connected with each other through the two second electrode pads close to the third side and the corresponding third conductive line.

7. The touch panel according to claim 6 further comprising: a plurality of fourth conductive lines, disposed on a fourth side of the substrate that is opposite to the third side, wherein every adjacent two of the second electrode lines are connected with each other through the two second electrode pads close to the fourth side and the corresponding fourth conductive line.

8. The touch panel according to claim 1, wherein a plurality of gaps exists between the first electrode pads and the second electrode pads.

9. The touch panel according to claim 8, wherein a width of the gaps is between 10 μm and 500 μm.

10. The touch panel according to claim 8 further comprising: a plurality of dummy patterns, disposed in the gaps.

11. The touch panel according to claim 10, wherein each of the first electrode pads has at least one opening on the first central portion of the first electrode pad.

12. The touch panel according to claim 11, wherein the dummy patterns are disposed in the openings of the first electrode pads.

13. The touch panel according to claim 10, wherein spaces between the dummy patterns and the adjacent first electrode pads and spaces between the dummy patterns and the adjacent second electrode pads are between 10 μm and 40 μm.

14. The touch panel according to claim 10, wherein the dummy patterns are in a block shape or a strip shape.

15. The touch panel according to claim 10, wherein a length of the dummy patterns is between 25 μm and 450 μm.

* * * * *